United States Patent
Takagi

(10) Patent No.: US 9,478,653 B2
(45) Date of Patent: Oct. 25, 2016

(54) FIELD EFFECT TRANSISTOR AND SEMICONDUCTOR DEVICE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/798,627

(22) Filed: Jul. 14, 2015

(65) Prior Publication Data

US 2016/0056275 A1    Feb. 25, 2016

(30) Foreign Application Priority Data

Aug. 22, 2014   (JP) .................................. 2014-169667

(51) Int. Cl.
*H01L 29/417* (2006.01)
*H01L 29/04* (2006.01)
(Continued)

(52) U.S. Cl.
CPC ..... *H01L 29/7787* (2013.01); *H01L 23/49541* (2013.01); *H01L 23/49838* (2013.01); *H01L 23/535* (2013.01); *H01L 29/04* (2013.01); *H01L 29/045* (2013.01); *H01L 29/0696* (2013.01); *H01L 29/2003* (2013.01); *H01L 29/41758* (2013.01); *H01L 29/41775* (2013.01); *H01L 29/42356* (2013.01); *H01L 29/7786* (2013.01);
(Continued)

(58) Field of Classification Search
CPC . H01L 29/417; H01L 29/04; H01L 29/7787; H01L 29/41775; H01L 29/42356; H01L 29/41758
See application file for complete search history.

(56) References Cited

U.S. PATENT DOCUMENTS

2003/0011577 A1* 1/2003 Katsuki ................. G06F 3/0436
                                                                345/173
2011/0018631 A1* 1/2011 Ng .......................... H03F 1/086
                                                                330/151
(Continued)

FOREIGN PATENT DOCUMENTS

| JP | 2007-243018 | 9/2007 |
| JP | 2008-244295 A | 10/2008 |
| JP | 4965982 | 7/2012 |

OTHER PUBLICATIONS

Extended European Search Report issued Feb. 29, 2016 in Patent Application No. 15175547.7.

*Primary Examiner* — Phuc Dang
(74) *Attorney, Agent, or Firm* — Oblon, McClelland, Maier & Neustadt, L.L.P.

(57) ABSTRACT

A field effect transistor includes multi-finger electrodes, a gate terminal electrode, a drain terminal electrode, a source terminal and a source terminal electrode. Each of the multi-finger electrodes includes two finger gate electrodes, a finger drain electrode, and at least two finger source electrodes. Finger electrodes are arranged so as to intersect with the first straight line at an angle of approximately +45 degrees and approximately −45 degrees alternately. The gate terminal electrode commonly bundles and connects the finger gate electrodes of two adjacent cell regions. The drain terminal electrode commonly bundles and connects the finger drain electrodes of two adjacent cell regions. And the source terminal electrode commonly bundles and connects the finger source electrodes of two adjacent cell regions. The gate terminal electrodes and the drain terminal electrodes are alternately provided in a connecting region of the multi-finger electrodes of two adjacent cell regions.

12 Claims, 6 Drawing Sheets

(51) Int. Cl.
*H01L 29/778* (2006.01)
*H01L 29/20* (2006.01)
*H01L 23/495* (2006.01)
*H01L 23/498* (2006.01)
*H01L 23/535* (2006.01)
*H01L 29/06* (2006.01)
*H01L 29/423* (2006.01)
*H01L 23/66* (2006.01)
*H01L 29/812* (2006.01)

(52) U.S. Cl.
CPC ............ *H01L 23/66* (2013.01); *H01L 29/4175* (2013.01); *H01L 29/812* (2013.01); *H01L 2223/6611* (2013.01); *H01L 2224/4911* (2013.01); *H01L 2224/49175* (2013.01); *H01L 2924/19043* (2013.01); *H01L 2924/19105* (2013.01); *H01L 2924/19107* (2013.01)

(56) References Cited

U.S. PATENT DOCUMENTS

| | | | |
|---|---|---|---|
| 2013/0228788 A1* | 9/2013 | Yamamura | H01L 29/2003 257/76 |
| 2014/0252416 A1 | 9/2014 | Takagi | |

* cited by examiner $\gamma = \alpha g + \beta g$

FIELD EFFECT TRANSISTOR AND
SEMICONDUCTOR DEVICE

CROSS-REFERENCE TO RELATED APPLICATIONS

This application is based upon and claims the benefit of priority from Japanese Patent Application No. 2014-169667, filed on Aug. 22, 2014; the entire contents of which are incorporated herein by reference.

FIELD

Embodiments described herein relate generally a field effect transistor and a semiconductor device.

BACKGROUND

Expanding the operating region of a field effect transistor made of e.g. GaAs facilitates increasing the output power of an inverter circuit, switching circuit, microwave circuit and the like. The GaAs-based material has low thermal conductivity. Thus, for instance, cells are arranged on a narrow and thin chip, thereby improving heat dissipation.

Wide bandgap semiconductors such as SiC and GaN have high thermal conductivity. Thus, it is easy to increase the output power by increasing the heat generation density several times higher than that of GaAs without thinning the thickness of the chip. In this case, the thermal resistance can be reduced by optimizing the spacing between a plurality of cell regions, i.e., partitioned operating regions.

In the case of microwave frequency high-power amplifier circuits based on e.g. HEMT, it is desired to arrange a plurality of cell regions so as to avoid loop oscillation.

DETAILED DESCRIPTION

In general, according to one embodiment, a field effect transistor includes a plurality of cell regions with an operating current controlled by finger electrodes provided on an operating layer made of semiconductor. The cell regions have centers on a first straight line. The field effect transistor includes a plurality of multi-finger electrodes, a gate terminal electrode, a drain terminal electrode and a source terminal electrode. Each of the multi-finger electrodes includes at least two finger gate electrodes, a finger drain electrode, and at least two finger source electrodes. The finger drain electrode and the finger source electrode are provided so as to sandwich each of the finger gate electrodes. The finger gate electrodes, the finger drain electrode and the finger source electrodes are parallel in each of the cell regions. Finger electrodes of the each of the multi-finger electrodes are arranged so as to intersect with the first straight line at an angle of approximately +45 degrees and approximately −45 degrees alternately. The gate terminal electrode commonly bundles and connects the finger gate electrodes of two adjacent cell regions. The drain terminal electrode commonly bundles and connects the finger drain electrodes of two adjacent cell regions. And the source terminal electrode commonly bundles and connects the finger source electrodes of two adjacent cell regions. Multi-finger electrodes of two adjacent cell regions are symmetric with respect to a second straight line orthogonal to the first straight line each other, and generally orthogonal each other. The gate terminal electrodes and the drain terminal electrodes are alternately provided in a connecting region of the multi-finger electrodes of two adjacent cell regions. And the source terminal electrodes are provided on an opposite side of the gate terminal electrode and on an opposite side of the drain terminal electrode alternately with respect to the first straight line.

Embodiments of the invention will now be described with reference to the drawings.

Figure 1:
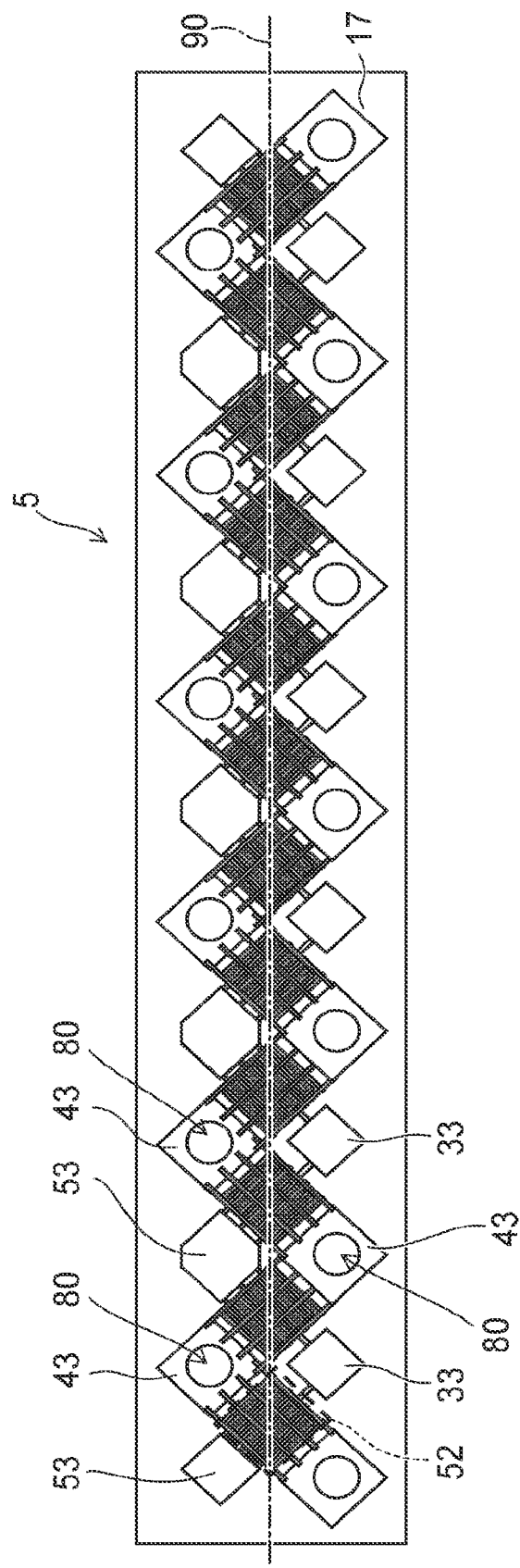
FIG. 1 is a schematic plan view of a field effect transistor according to a first embodiment.

FIG. 1 is a schematic plan view of a field effect transistor according to a first embodiment.

The field effect transistor 5 includes a semiconductor substrate, a plurality of cell regions 52, a gate terminal electrode 33, a source terminal electrode 43, and a drain terminal electrode 53. The semiconductor substrate is made of e.g. SiC or GaN and has a hexagonal crystal structure.

The centers of the plurality of cell regions 52 are arranged on a first straight line 90. Finger electrodes are arranged so that the finger directions of the finger electrodes intersect with the first straight line at an angle of approximately +45° and −45° alternately. The gate terminal electrode 33 and the drain terminal electrode 53 are alternately provided in a connecting region of the multi-finger electrodes of two adjacent cell regions. Furthermore, the source terminal electrodes 43 are provided on an opposite side of the gate terminal electrode 33 and on an opposite side of the drain terminal electrode 53 with respect to the first straight line 90.

Figure 2A:
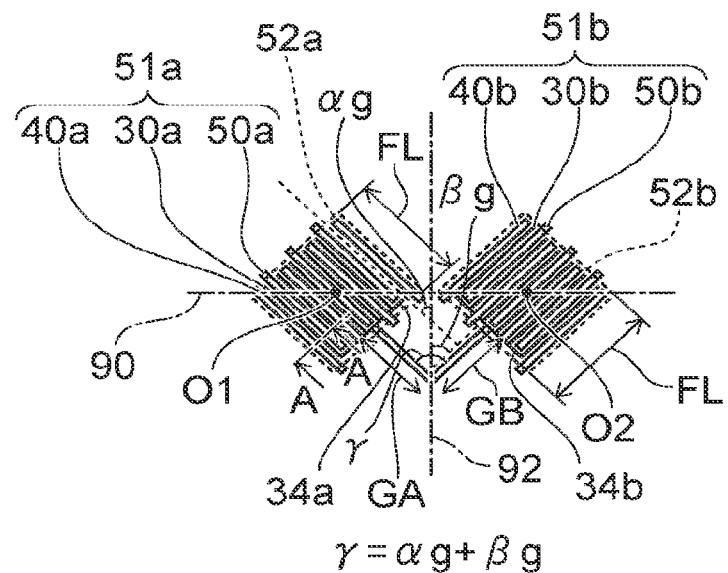
FIG. 2A is a schematic plan view of the cell region.
Figure 2B:
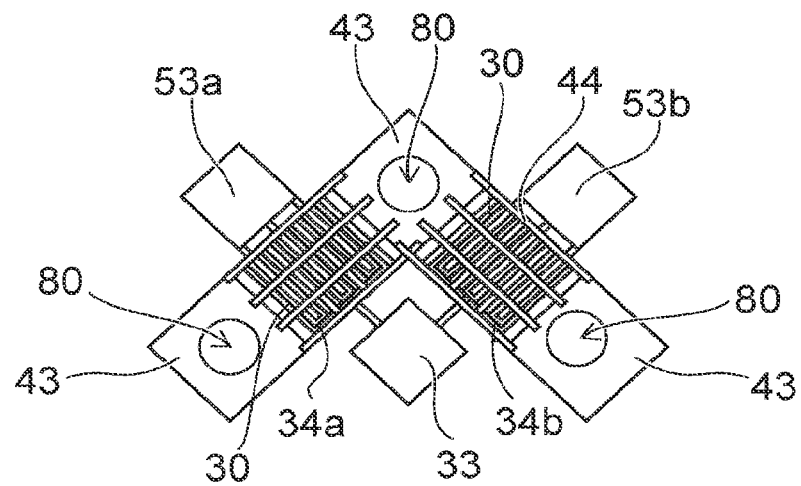
FIG. 2B is a schematic plan view of the cell region provided with a terminal electrode.
Figure 2C:
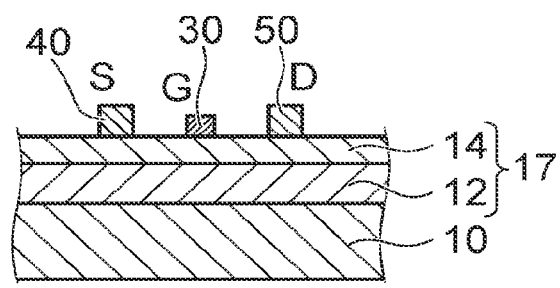
FIG. 2C is a schematic cross sectional view taken along line A-A.

FIG. 2A is a schematic plan view of the cell region. FIG. 2B is a schematic plan view of the cell region provided with a terminal electrode. FIG. 2C is a schematic sectional view taken along line A-A.

The cell regions 52a, 52b control the current by multi-finger electrodes 51a, 51b provided on the operating layer 17 made of e.g. nitride semiconductor.

As shown in FIG. 2A, the first straight line 90 is defined as the straight line connecting the center O1 of the multi-finger electrode 51a with the center O2 of the adjacent multi-finger electrode 51b. A second straight line 92 is orthogonal to the first straight line 90. The multi-finger electrode 51a and the multi-finger electrode 51b are symmetric with respect to the straight line parallel to the second straight line 92.

The multi-finger electrode 51a includes at least two finger gate electrodes 30a, a finger drain electrode 50a, and a finger source electrode 40a. The finger drain electrode 50a and the finger source electrode 40a are provided so as to sandwich each of the finger gate electrodes 30a. Similarly, the multi-finger electrode 51b includes at least two finger gate electrodes 30b, a finger drain electrode 50b, and a finger source electrode 40b. The finger drain electrode 50b and the finger source electrode 40b are provided so as to sandwich each of the finger gate electrode 30b. In one cell region, the finger gate electrode 30a, the finger drain electrode 50a, and finger source electrode 40a are parallel. The finger gate electrode 30a, the finger drain electrode 50a and the finger source electrode 40a are parallel. The finger gate electrode 30b, the finger drain electrode 50b and the finger source electrode 40b are parallel.

The finger length FL of the cell regions 52a, 52b can be set to e.g. 100 μm.

As shown in FIG. 2B, the first embodiment includes a gate terminal electrode 33, drain terminal electrodes 53a, 53b, and a source terminal electrode 43 in order to connect the multi-finger electrodes 51a, 51b to the terminal electrodes of a mounting member.

The finger drain electrodes 50a of the multi-finger electrode 51a of the cell region 52a are commonly bundled and connected to the drain terminal electrode 53a. The finger drain electrodes 50b of the multi-finger electrode 51b of the cell region 52b are commonly bundled and connected to the drain terminal electrode 53b. Also, the finger drain electrodes of two adjacent cell regions are commonly bundled and connected to a drain terminal electrode 53, as shown in FIG. 1. The finger source electrodes 40a, 40b of the multi-finger electrodes 51a, 51b are commonly bundled and connected to the source terminal electrode 43.

The respective finger source electrodes 40a, 40b of the two multi-finger electrodes 51a, 51b may be wired three-dimensionally by e.g. an air bridge 44 so as not to cross the finger gate electrodes 30a, 30b and the finger drain electrodes 50a, 50b.

The source terminal electrode 43 is connected to the ground through a conductive layer on the inner wall of the via hole 80 provided in the semiconductor layer.

The finger gate electrode 30a of the first multi-finger electrode 51a is connected to the gate terminal electrode 33 through a gate extraction part having a length of GA. The gate electrode 30b of the second multi-finger electrode 51b is connected to the gate terminal electrode 33 through a gate extraction part having a length of GB. The multi-finger electrode 51a includes a gate bus electrode 34a bundling at least two finger gate electrodes. Similarly, the multi-finger electrode 51b includes a gate bus electrode 34b bundling at least two finger gate electrodes. The gate bus electrode 34a, 34b is connected to the gate terminal electrode 33.

In this case, with respect to the second straight line 92, the opening angle αg of the finger gate electrode 30a is made generally equal to the opening angle βg of the finger gate electrode 30b. Then, the distance from the drain terminal electrode 53 to the semiconductor chip end surface is made uniform. Thus, the length of the bonding wire between the drain electrode 53 and the output matching circuit, is made uniform. Accordingly, the cell regions 52 can be operated in a balanced manner.

The operating region is partitioned into a plurality of cell regions. The cell regions are distributed or combined so as to suppress e.g. loop oscillation and not to produce phase difference. Thus, high amplification output can be achieved.

FIG. 2C is a schematic cross-sectional view of the field effect transistor. Semiconductor layers such as a buffer layer 12 made of e.g. GaN and an electron supply layer 14 made of e.g. AlGaN are stacked on a support substrate 10 made of e.g. SiC. The electron supply layer 14 and the buffer layer 12 constitute an operating layer 17 for forming a two-dimensional electron gas layer.

A finger gate electrode 30 is provided on the surface of the operating layer 17. A finger source electrode 40 and a finger drain electrode 50 are provided sandwiching the finger gate electrode 30. Such a field effect transistor can be called HEMT (high electron mobility transistor). GaN has high saturation electron velocity and insulation breakdown voltage. Thus, this field effect transistor can be used as a high-power amplifier element at frequencies above the microwave band. The operating layer 17 may be e.g. an n-type GaAs layer constituting a Schottky barrier with the finger gate electrode 30 to form a MESFET (metal semiconductor field effect transistor).

Figure 3:
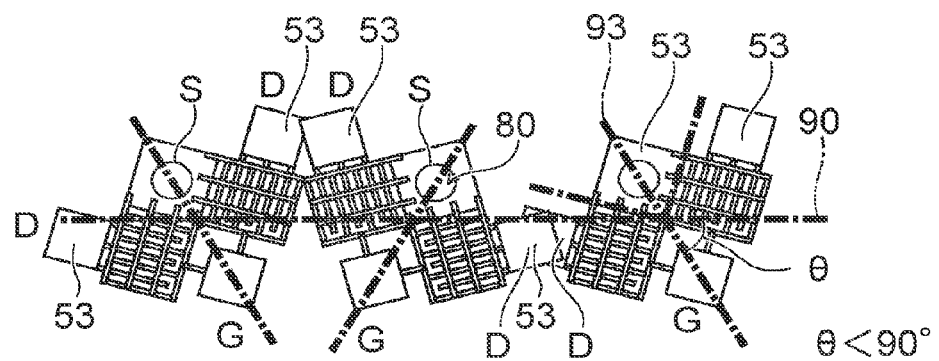
FIG. 3 is a schematic plan view of a field effect transistor according to a first comparative example.

FIG. 3 is a schematic plan view of a field effect transistor according to a first comparative example.

A third straight line 93 is defined as the symmetry line of two adjacent cell regions. Cell regions are arranged with rotation at a crossing angle of θ (<90°) or −θ with respect to the first straight line 90 shown in FIG. 2A. In the first comparative example, the crossing angle θ of the first straight line 90 and the third straight line 93 is not orthogonal. In this case, as shown in this figure, the distance of the drain terminal electrode 53 from the semiconductor chip end surface is different depending on the cell region. That is, the length of the bonding wire between the drain terminal electrode 53 and the output matching circuit is changed with the position of the drain terminal electrode 53. Thus, the inductance is changed. Accordingly, imbalance is likely to occur in the operation of the cell regions 52.

In contrast, in the first embodiment, the multi-finger electrodes of two adjacent cell regions are arranged so that the finger directions thereof are symmetric with respect to the second straight line 92 orthogonal to the first straight line 90. Thus, the length of the bonding wire between the drain terminal electrode 53 and the output matching circuit is made uniform. Accordingly, a plurality of cell regions 52 can be operated in a balanced manner.

Figure 4:
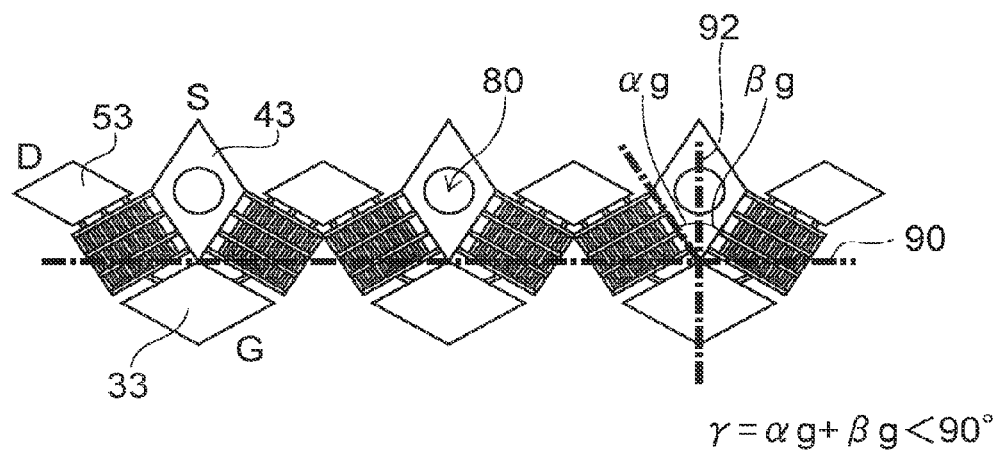
FIG. 4 is a partial schematic plan view of a field effect transistor according to a second comparative example.

FIG. 4 is a partial schematic plan view of a field effect transistor according to a second comparative example. In the second comparative example, the second straight line 92 crosses the finger gate electrode 30 of the multi-finger electrode 51a at an angle of αg (0<αg<90°). The second straight line 92 crosses the multi-finger electrode 51b at an angle of βg (0<βg<90°).

For instance, the crossing angle γ(=αg+βg) of the finger gate electrodes 30 of two multi-finger electrodes 51a, 51b is 60 degrees. Then, the planar shape of the source terminal electrode 43 is constrained. This increases e.g. the distance from the finger source electrode 40 to the ground part of the mounting member and may degrade the frequency characteristics. Furthermore, when a via hole 80 and a source terminal electrode 43 are provided at this position, the shape of the via hole 80 is constrained. Preferably, the crossing angle γ is generally orthogonal. That is, the crossing angle γ is preferably 80 degrees or more and 100 degrees or less, and more preferably 85 degrees or more and 95 degrees or less.

In this specification, the statement that "the crossing angle is generally orthogonal" means that "the crossing angle is 80 degrees or more and 100 degrees or less".

Figure 5:
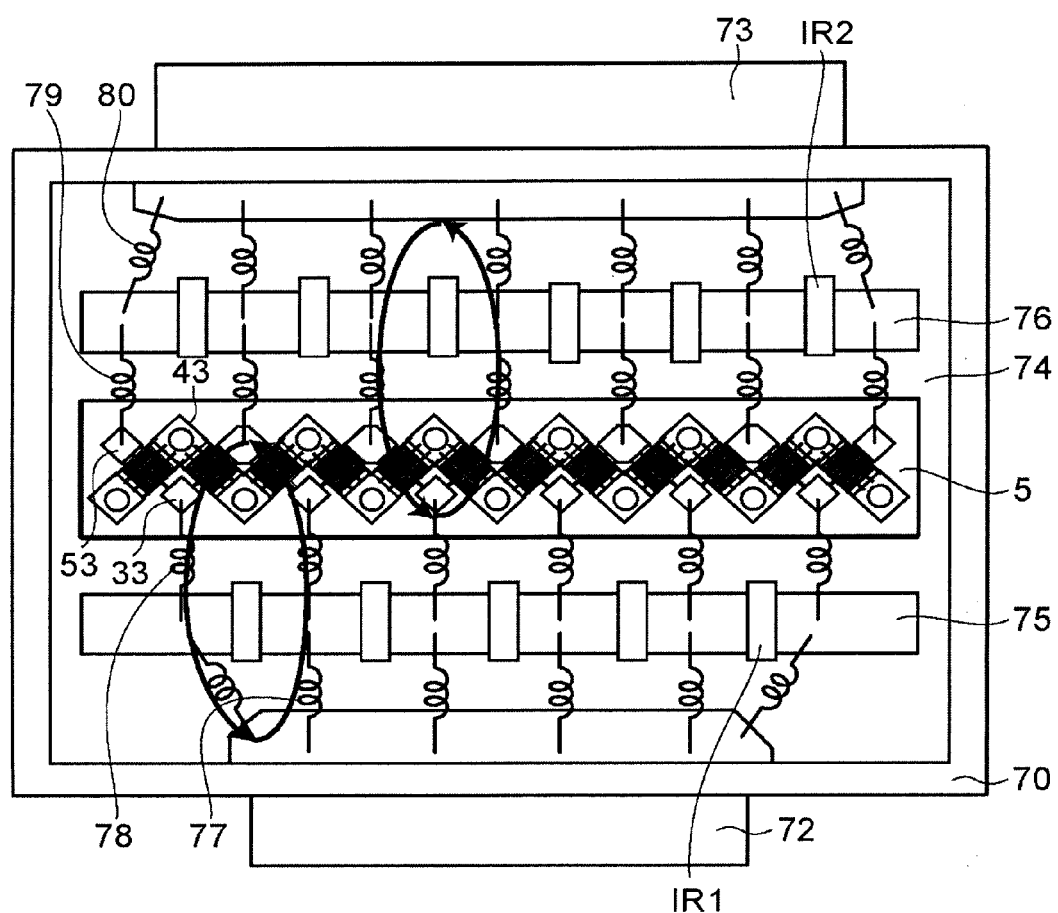
FIG. 5 is a schematic plan view of a semiconductor device based on the field effect transistor according to this embodiment.

FIG. 5 is a schematic plan view of a semiconductor device based on the field effect transistor according to first embodiment.

The semiconductor device includes the field effect transistor 5 according to first embodiment, a mounting member (package) 70, an input circuit substrate 75, and an output circuit substrate 76.

The mounting member 70 is made of an insulating material such as ceramic, or a metal plate. The mounting member 70 includes an input conductive part 72, an output conductive part 73, and a ground conductive part 74. The input circuit substrate 75 is made of e.g. ceramic. The input circuit substrate 75 is provided between the input conductive part 72 and the field effect transistor 5 and bonded to the ground conductive part 74. The output circuit substrate 76 is made of e.g. ceramic. The output circuit substrate 76 is provided between the output conductive part 73 and the field effect transistor 5 and bonded to the ground conductive part 74.

In each cell region 52, the drain terminal electrodes 53 are not connected each other in the field effect transistor 5, but connected to the conductive part of the output circuit substrate 76 by a bonding wire 79. The gate terminal electrodes 33 are not connected each other in the field effect transistor 5, but connected to the conductive part of the input circuit substrate 75 by a bonding wire 78.

As the result, any two cells do not constitute a loop circuit in the chip of the field effect transistor 5. A loop circuit is always constituted so as to include a circuit outside the chip. This facilitates suppressing unnecessary oscillation because this makes isolation resistors IR1, IR2 in an external circuit effective.

Figure 6A:
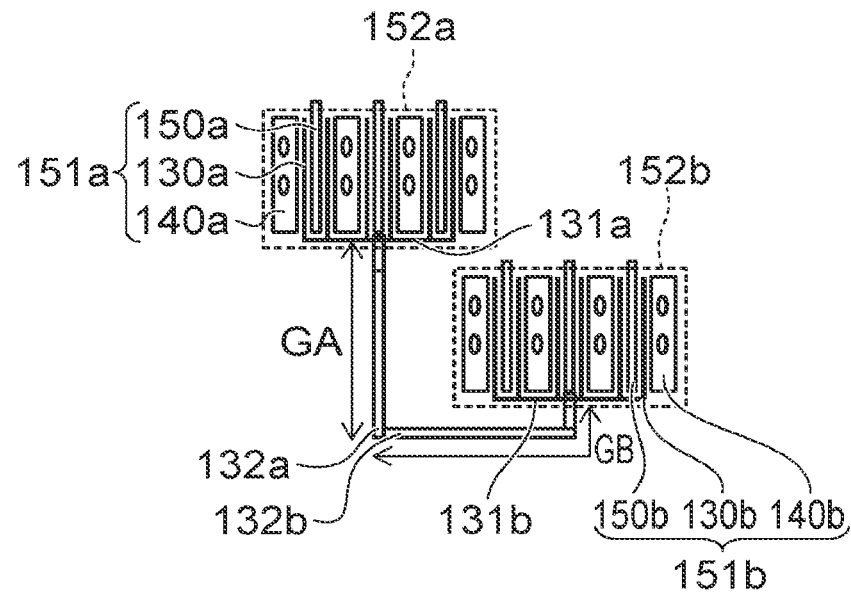
FIG. 6A is a schematic plan view of a cell region of a field effect transistor according to a third comparative example and FIG. 6B is a schematic plan view of the cell region connected to a terminal electrode.
Figure 6B:
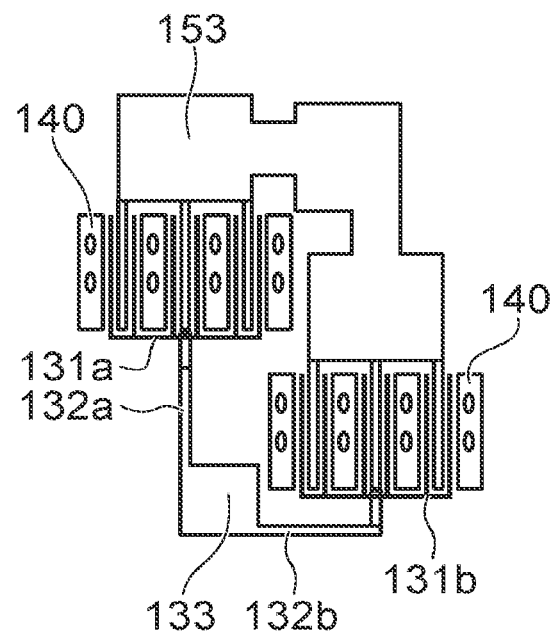

FIG. 6A is a schematic plan view of a cell region of a field effect transistor according to a third comparative example. FIG. 6B is a schematic plan view of the cell region connected to a terminal electrode.

As shown in FIG. 6A, a first cell region 152a and a second cell region 152b are arranged at shifted positions on the chip surface. The length GA of the gate extraction part 132a from the gate bus electrode 131a of the first multi-finger electrode 151a is equal to the length GB of the gate extraction part 132b from the second gate bus electrode 131b.

As shown in FIG. 6B, the gate terminal electrode 133 is connected to each of the gate extraction parts 132a, 132b. The source terminal electrode 140a, 140b is connected to a conductive layer provided on the inner wall of e.g. a via hole. Furthermore, the finger drain electrode 150a, 150b is connected to a drain terminal electrode 153.

In the third comparative example, the cell region is provided with six gate electrodes having a finger length of 100 μm. Twelve cell regions of this configuration are arranged in a semiconductor device. The thermal resistance of the semiconductor device was 1.11° C./W.

In contrast, in the first embodiment shown in FIG. 1, for an equal finger length FL of 100 μm, the thermal resistance was 0.92° C./W. This is lower by generally 20% than that of the third comparative example.

In the first embodiment shown in FIG. 1, the cell regions are arranged with rotation. This reduces the length of the connection line GA, GB between the two cell regions and the gate terminal electrode 33, and the connection line length between the two cell regions and the drain terminal electrode 53. Thus, the radio frequency characteristics are made more uniform.

Figure 7:
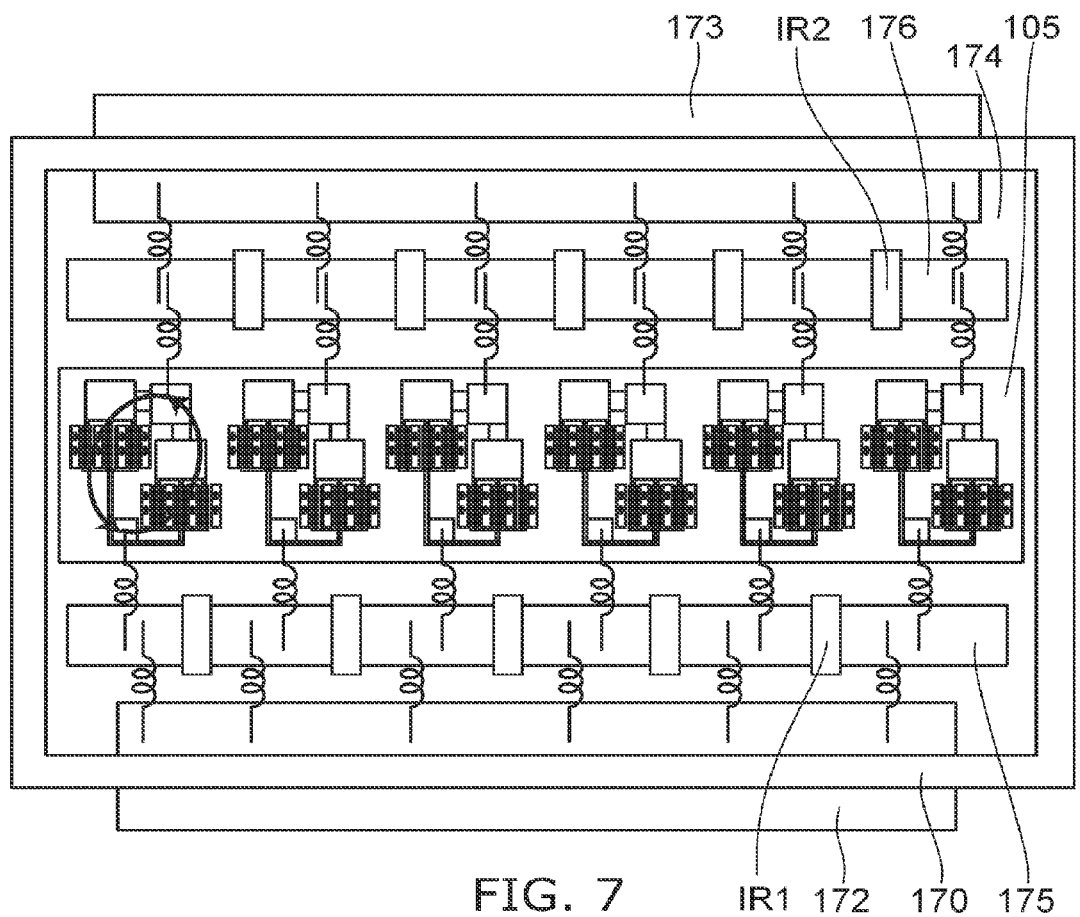
FIG. 7 is a schematic plan view of a semiconductor device based on the field effect transistor according to the third comparative example.

FIG. 7 is a schematic plan view of a semiconductor device based on the field effect transistor according to the third comparative example.

The semiconductor device includes the field effect transistor 105 according to the third comparative example, a mounting member 170, an input circuit substrate 175, and an output circuit substrate 176.

The mounting member 170 includes an input conductive part 172, an output conductive part 173, and a ground conductive part 174. The input circuit substrate 175 is provided between the input conductive part 172 and the field effect transistor 105 and bonded to the ground conductive part 174. The output circuit substrate 176 is provided between the output conductive part 173 and the field effect transistor 105 and bonded to the ground conductive part 174.

The drain terminal electrode 153 connecting the first cell region 152a with the second cell region 152b is connected in the field effect transistor 105. Thus, the gate terminal electrode 133 and the drain terminal electrode 153 form a loop circuit in the chip. The loop circuit may cause oscillation by e.g. harmonics. However, it is difficult to suppress the oscillation in the outside including the matching circuit.

Figure 8:
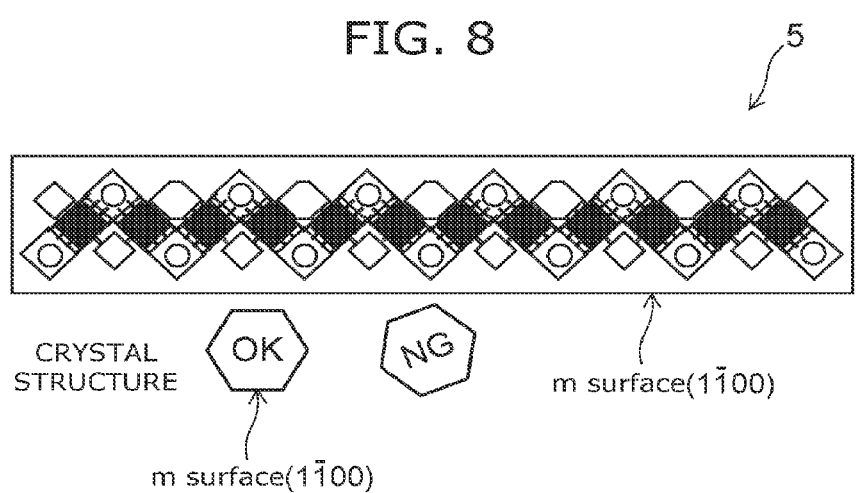
FIG. 8 is a schematic plan view of a field effect transistor according to a second embodiment.

FIG. 8 is a schematic plan view of a field effect transistor according to a second embodiment.

The operating layer is made of a hexagonal crystal such as GaN. In this case, the m surface (non-polar surface) is made parallel to the first straight line 90. The opening angle αg is set to 45 degrees, and the opening angle βg is set to 45 degrees. Then, the electrical characteristics of a plurality of cell regions can be made uniform. In contrast, for instance, the placement with an opening angle αg of 0 degrees and an opening angle βg of 90 degrees is undesirable, because the electrical characteristics are different between different cell regions.

In the field effect transistor 5 according to the first and second embodiments, the chip heat generating regions are arranged in a distributed manner. This facilitates suppressing loop oscillation. Thus, high amplification output can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A field effect transistor including a plurality of cell regions with an operating current controlled by finger electrodes provided on an operating layer made of semiconductor, the cell regions having centers on a first straight line, the field effect transistor comprising:

a plurality of multi-finger electrodes, each of the multi-finger electrodes including at least two finger gate electrodes, a finger drain electrode, and at least two finger source electrodes, the finger drain electrode and the finger source electrodes being provided so as to sandwich each of the finger gate electrodes, the finger gate electrodes, the finger drain electrode and the finger source electrodes being parallel in each of the cell regions, finger electrodes of the each of the multi-finger electrodes being arranged so as to intersect with the first straight line at an angle of approximately +45 degrees and approximately −45 degrees alternately;

a gate terminal electrode commonly bundling and connecting the finger gate electrodes of two adjacent cell regions;

a drain terminal electrode commonly bundling and connecting the finger drain electrodes of two adjacent cell regions; and a source terminal electrode having a first region provided on an opposite side of the gate terminal electrode and a second region provided on an opposite side of the drain terminal electrode, each of the finger source electrodes being connected to the first region and the second region, respectively, multi-finger electrodes of two adjacent cell regions being symmetric with respect to a second straight line orthogonal to the first straight line each other, and generally orthogonal each other, the gate terminal electrode and the drain terminal electrode being alternately provided in a connecting region of the multi-finger electrodes of two adjacent cell regions, the first region commonly bundling the finger source electrodes of two adjacent cell regions, and the second region commonly bundling the finger source electrodes of two adjacent cell regions.

2. The transistor according to claim 1, wherein the source terminal electrode is grounded through a conductive layers on inner walls of via holes provided in a support substrate and the operating layer.

3. The transistor according to claim 2, wherein
the via holes are provided alternately in a region sandwiched between two adjacent drain terminal electrodes and a region sandwiched between two adjacent gate terminal electrodes.

4. The transistor according to claim 1, wherein
the each of the multi-finger electrodes further includes a gate bus electrode bundling the at least two finger gate electrodes, and
the gate bus electrode is connected to the gate terminal electrode.

5. The transistor according to claim 1, wherein
the operating layer is made of a hexagonal semiconductor, and
the first straight line is parallel to an m surface of the hexagonal semiconductor.

6. The transistor according to claim 5, wherein the hexagonal semiconductor includes GaN.

7. A semiconductor device comprising:
the field effect transistor according to claim 1;
a mounting member including an input conductive part, an output conductive part, and a ground conductive part;
an input circuit substrate provided between the input conductive part and the field effect transistor and bonded to the ground conductive part; and
an output circuit substrate provided between the output conductive part and the field effect transistor and bonded to the ground conductive part,
the drain terminal electrodes being each electrically connected to the output circuit substrate, and the gate terminal electrodes being each electrically connected to the input circuit substrate, but the gate terminal electrode and the drain terminal electrode connected to one cell region not constituting a loop circuit in the field effect transistor.

8. The device according to claim 7, wherein the source terminal electrode is grounded through conductive layers on an inner walls of via holes provided in a support substrate and the operating layer.

9. The device according to claim 8, wherein
the via holes are provided alternately in a region sandwiched between two adjacent drain terminal electrodes and a region sandwiched between two adjacent gate terminal electrodes.

10. The device according to claim 7, wherein
the each of the multi-finger electrodes further includes a gate bus electrode bundling the at least two finger gate electrodes, and
the gate bus electrode is connected to the gate terminal electrode.

11. The device according to claim 7, wherein
the operating layer is made of a hexagonal semiconductor, and
the first straight line is parallel to an m surface of the hexagonal semiconductor.

12. The device according to claim 11, wherein the hexagonal semiconductor includes GaN.

* * * * *